(12) United States Patent
Yeo et al.

(10) Patent No.: US 6,855,990 B2
(45) Date of Patent: Feb. 15, 2005

(54) STRAINED-CHANNEL MULTIPLE-GATE TRANSISTOR

(75) Inventors: Yee-Chia Yeo, Singapore (SG); Fu-Liang Yang, Hsin-chu (TW); Chenming Hu, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 26 days.

(21) Appl. No.: 10/305,841

(22) Filed: Nov. 26, 2002

(65) Prior Publication Data

US 2004/0099903 A1 May 27, 2004

(51) Int. Cl.[7] .............................................. H01L 27/01
(52) U.S. Cl. ..................... 257/353; 257/347; 257/401; 257/619; 257/623
(58) Field of Search ............................... 257/192, 194, 257/347, 353, 401, 619, 623

(56) References Cited

U.S. PATENT DOCUMENTS

| | | | | |
|---|---|---|---|---|
| 5,607,865 A | * | 3/1997 | Choi et al. ................. | 438/164 |
| 6,342,410 B1 | * | 1/2002 | Yu ............................. | 438/164 |
| 6,475,869 B1 | * | 11/2002 | Yu ............................. | 438/303 |
| 6,605,514 B1 | * | 8/2003 | Tabery et al. ............... | 438/303 |
| 6,611,029 B1 | * | 8/2003 | Ahmed et al. .............. | 257/365 |
| 6,635,909 B2 | * | 10/2003 | Clark et al. ................. | 257/192 |
| 2004/0007715 A1 | * | 1/2004 | Webb et al. ................ | 257/192 |
| 2004/0031979 A1 | * | 2/2004 | Lochtefeld et al. ......... | 257/233 |
| 2004/0061178 A1 | * | 4/2004 | Lin et al. .................... | 257/350 |
| 2004/0075122 A1 | * | 4/2004 | Lin et al. .................... | 257/288 |

OTHER PUBLICATIONS

Geppert, The Amazing Vanishing Transistor Act, Oct. 2002, IEEE Spectrum, pp. 28–33.*

* cited by examiner

Primary Examiner—George Eckert
(74) Attorney, Agent, or Firm—Tung & Associates

(57) ABSTRACT

A multiple-gate semiconductor structure is disclosed which includes a substrate, a fin formed of a semi-conducting material that has a top surface and two sidewall surfaces. The fin is subjected to a strain of at least 0.01% and is positioned vertically on the substrate; source and drain regions formed in the semi-conducting material of the fin; a gate dielectric layer overlying the fin; and a gate electrode wrapping around the fin on the top surface and the two sidewall surfaces of the fin overlying the gate dielectric layer. A method for forming the multiple-gate semiconductor structure is further disclosed.

42 Claims, 4 Drawing Sheets

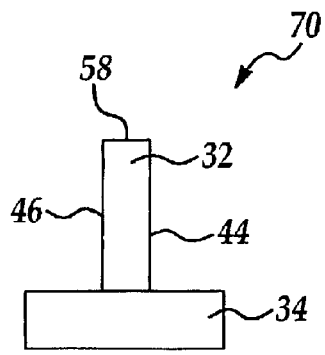
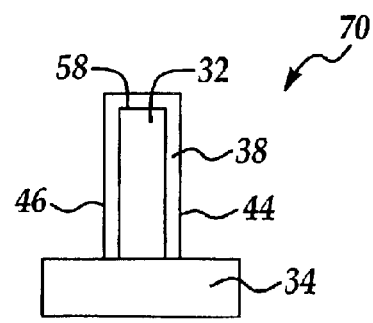
Figure 10A  Figure 10B
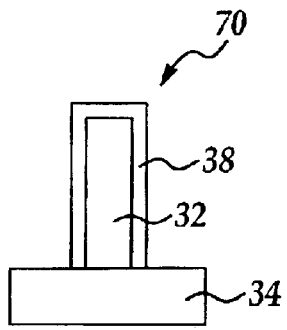
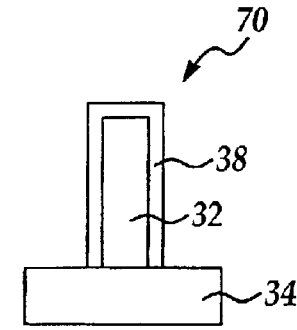
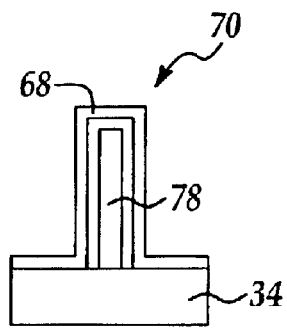
Figure 10C  Figure 10D  Figure 10E
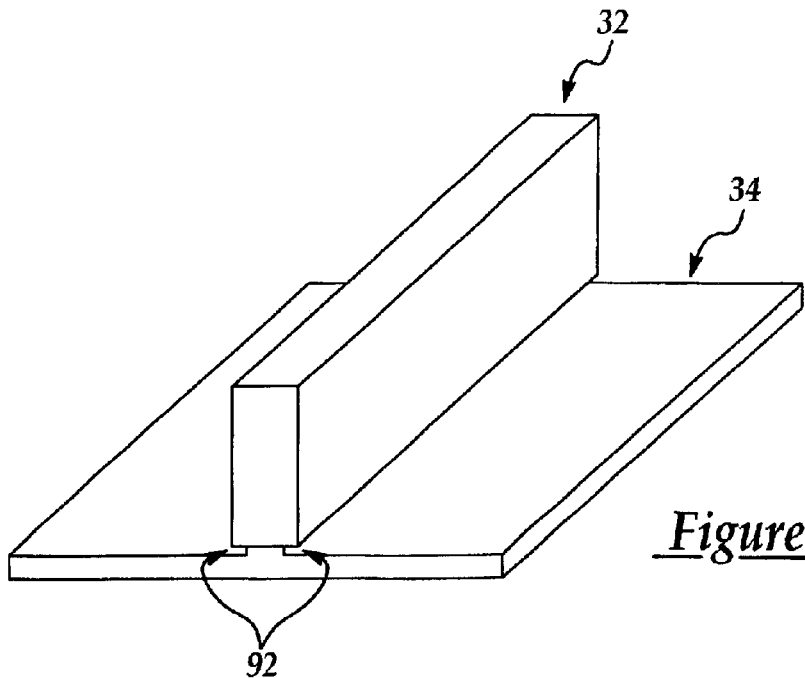
Figure 11

US 6,855,990 B2

STRAINED-CHANNEL MULTIPLE-GATE TRANSISTOR

FIELD OF THE INVENTION

The present invention generally relates to a multiple-gate transistor and method for fabricating and more particularly, relates to a strained-channel multiple-gate transistor and method for fabrication.

BACKGROUND OF THE INVENTION

Size reduction of the metal-oxide-semiconductor field-effect transistor (MOSFET) has enabled the continued improvement in speed performance, density, and cost per unit function of integrated circuits over the past few decades. As the gate length of the conventional bulk MOSFET is reduced, the interaction of the source and drain with the channel is increased resulting in gained influence on the channel potential. Consequently, a transistor with a short gate length suffers from problems related to the inability of the gate to substantially control the on/off states of the channel. Phenomena such as reduced gate control associated with transistors having short channel lengths are known as short-channel effects. Increased body doping concentration, reduced gate oxide thickness, and ultra-shallow source/drain junctions are ways to suppress short-channel effects.

When the gate length is scaled down into the sub-50 nanometer (nm) regime, the requirements for body-doping concentration, gate oxide thickness, and source/drain (S/D) doping profiles to control short-channel effects become increasingly difficult to meet when conventional device structures based on bulk silicon (Si) substrates are employed. For device scaled down well into the sub-50 nm regime, a promising approach for controlling short-channel effects is to use an alternative device structure and the surround-gate or wrap-around gate structure. The multiple-gate transistor structure is expected to extend the scalability of CMOS technology beyond the limitations of the conventional bulk MOSFET. The introduction of additional gates improves the capacitance coupling between the gates and the channel, increases the control of the channel potential by the gate, helps the suppression of short channel effects, and prolongs the scalability of the MOS transistor.

Strain-induced mobility enhancement is another approach to improve transistor performance in addition to device scaling. Significant mobility enhancement has been reported for both electrons and holes in conventional bulk transistors using silicon channel under biaxial tensile strain. It would be desirable to exploit the effects of strain-induced band structure modification to enhance carrier mobilities in multiple-gate transistors. However, there has been no research publications on the use of strained channel for enhancement of performance in multiple-gate transistors. This is because techniques used to induce the biaxial tensile strain for enhancement of carrier mobilities in conventional bulk transistors are not applicable to multiple-gate transistor structures.

A conventional technique used to induce a biaxial tensile strain in the channel region of a conventional bulk MOSFET makes use of a relaxed silicon germanium (SiGe) buffer layer, as shown in device 10 of FIG. 1A. The relaxed SiGe layer 12 which is formed on top of the graded SiGe buffer layer 14 on top of Si substrate 16 has a larger lattice constant compared to relaxed Si. A thin layer 20 of epitaxial Si grown on relaxed SiGe 12 will be under biaxial tensile strain, as shown in FIG. 1B. Both hole and electron mobilities are enhanced in the strained Si layer 20. Since a multiple gate device such as the double-gate fin FET structure resides on a silicon-on-insulator substrate and employs a fin-like channel, the conventional approach that employs a relaxed SiGe buffer is not applicable. In addition, the device structure and channel orientation of a multiple-gate transistor may be significantly different than that of the conventional bulk MOSFET. This means that the nature of strain required for enhancement of carrier mobilities in a multiple-gate device may be significantly different than that used for the conventional bulk MOSFET.

To overcome the shortcomings of the prior art, it is therefore an object of the invention to provide a multiple-gate transistor structure with a strained channel.

It is another object of the invention to illustrate the nature and direction of a useful strain required for a non-conventional multiple-gate device structure.

It is a further object of the invention to provide a method of manufacture for the strained-channel multiple-gate transistor.

SUMMARY OF THE INVENTION

In accordance with the present invention, a multiple-gate semiconductor structure and a method for fabricating the multiple-gate semiconductor structure are provided.

In a preferred embodiment, a multiple-gate semiconductor structure is provided which includes a substrate; a fin formed of a semi-conducting material that has a top surface and two sidewall surfaces, the fin is subjected to a strain of at least 0.01% and is positioned vertically on the substrate; source and drain regions formed in the semi-conducting material of the fin; a gate dielectric layer overlying the fin; and a gate electrode wrapping around the fin on the top surface and the sidewall surfaces of the fin overlying the gate dielectric layer.

In the multiple-gate semiconductor structure, the fin maybe under tensile strain in the source-to-drain direction, or maybe under compressive strain in the source-to-drain direction. A magnitude of the strain is between 0.01% and 2%. The semi-conducting material may be silicon, or a material including silicon and germanium. The fin may be rounded at the top corners. The gate dielectric layer may include silicon oxide or silicon oxynitride. The gate dielectric layer may include a high permittivity material such as, but not limited to, $La_2O_3$, $Al_2O_3$, $HfO_2$, $HfON$ and $ZrO_2$. The relative permittivity of the gate dielectric layer is at least 5, while a thickness of the gate dielectric layer may be featuring 3 Å and 100 Å. The gate dielectric layer may have a different thickness on the two sidewall surfaces and the top surface of the fin. The gate dielectric layer may have a first thickness on the top surface of the fin and a second thickness on the sidewall surfaces of the fin, wherein the first thickness is smaller than the second thickness. The gate dielectric layer may have a thickness of less than 20 Å on the top surface of the fin. The gate electrode may include polycrystalline silicon. The gate electrode may further include polycrystalline silicon germanium, or metal. The source and drain regions each may have a lightly doped or extension region. The source and drain regions may be straddled by a conductive material such as metal or silicide. Contacts between the gate electrode and the source and drain regions may be on the sidewall surfaces or on the top surface of the fin.

The present invention is further directed to a multiple-gate semiconductor structure which includes a substrate that has a depression in a top surface, the depression may be an undercut or a notch; a fin formed of a semi-conducting material that has a top surface and two sidewall surfaces, the fin is subjected to a strain of at least 0.01% and is positioned vertically juxtaposed to the depression in the top surface of the substrate; a gate dielectric layer overlying the fin; and a gate electrode wrapping around the fin on the two sidewall surfaces, the top surface and a bottom of a base of the fin.

The present invention is still further directed to a method for fabricating a multiple-gate semiconductor structure that can be carried out by the operating steps of providing a substrate that is formed of an insulating material that has a semi-conducting layer on top; patterning and forming a fin in the semi-conducting layer, the fin has two sidewall space surfaces and a top surface; depositing a layer of a dielectric material overlying the fin; depositing a layer of a conducting material overlying the layer of dielectric material; patterning the layer of conductive material forming a gate straddling across the two sidewall surfaces and the top surface of the fin; forming a source and a drain region in the semi-conducting layer; and depositing a layer of a thin film overlying at least partially the source and drain regions.

The method for fabricating a multiple-gate semiconductor structure may further include the step of forming the semi-conducting layer in a material including silicon, or including silicon and germanium. The method may further include the step of forming the insulating layer in a material including silicon oxide. The fin forming step may further include a fin surface smoothing step, while the fin surface smoothing step may further include sub-steps of sacrificial oxidation in high temperature annealing in a hydrogen ambient. The method may further include the step of forming the gate dielectric layer in a material including silicon oxide, or in a material including silicon oxynitride. The method may further include the step of forming the gate dielectric layer using a high permittivity material such as $La_2O_3$, $Al_2O_3$, $HfO_2$, HfON and $ZrO_2$. The high permittivity material may have a relative permittivity of at least 5. The method may further include the step forming the gate dielectric layer to a thickness between 3 Å and 100 Å. The method may further include the step of forming a different thickness of the gate dielectric layer on the sidewall surfaces and on the top surface of the fin.

The method may further include the step of forming the gate dielectric layer to a smaller thickness on the top surface of the fin compared to the gate dielectric layer on the sidewall surfaces of the fin, or the step of forming the gate dielectric layer on the top surface of the fin to a thickness of less than 20 Å. The method may further include the step of forming the gate in a material including polycrystalline silicon, or in a material including polysilicon germanium. The method may further include the step of forming the source and drain regions with a lightly doped or extension region, or the step of forming a layer of a conductive material overlying the source and drain regions. The method may further include the step of forming the layer of conductive material in a material selected from the group consisting of metal, metallic silicide, and metallic nitride. The method may further include the step of forming the layer of a thin film in a high-stress material, or forming the layer of thin film in silicon nitride. The method may further include the step of forming the layer of thin film to include a tensile strain component in a channel region that is in the source-to-drain direction. The method may further include the step of forming the layer of thin film to induce a compressive strain component in a channel region that is in the source-to-drain direction.

BRIEF DESCRIPTION OF THE DRAWINGS

These and other objects, features and advantages of the present invention will become apparent from the following detailed description and the appended drawings in which:

FIGS. 10A–10E are enlarged, cross-sectional views of the various process steps for the present invention transistor taken along lines C—C of FIG. 7.

FIG. 11 is a perspective view of still another embodiment of the present invention having an undercut or a notch in the substrate.

DETAILED DESCRIPTION OF THE PREFERRED EMBODIMENT

The present invention discloses a method of manufacturing for strained channel field effect transistors with multiple-gates capable of scaling down the complementary metal-oxide-semiconductor (CMOS) technology well into the sub-50 nanometer (NM) regime.

Figure 1A:
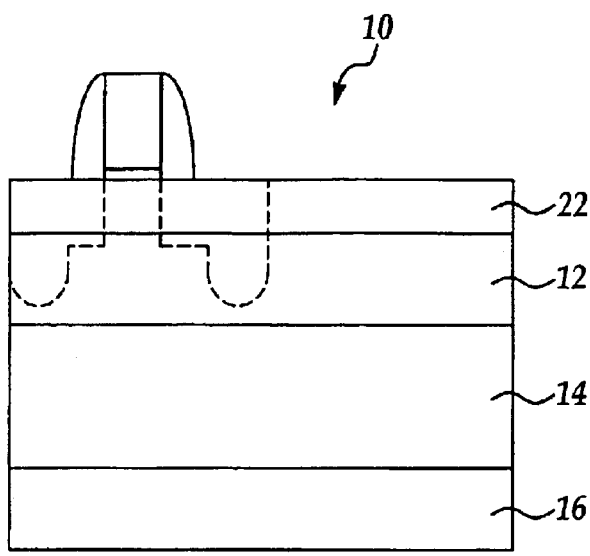
FIGS. 1A and 1B illustrate a conventional bulk MOSFET that utilizes a relaxed silicon germanium buffer layer to induce a biaxial tensile strain in the channel region.
Figure 1B:
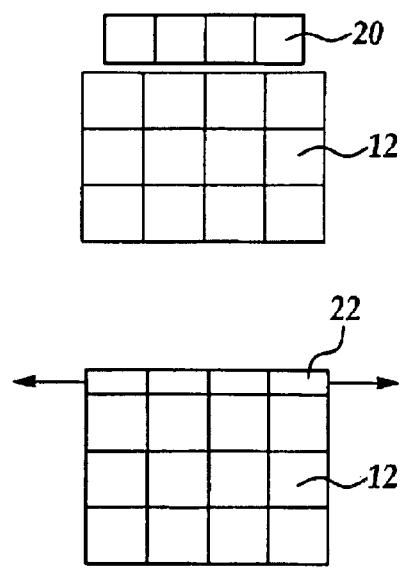

FIG. 1A illustrates a technique to induce strain in the Si channel of a conventional bulk MOSFET 10 by growing an epitaxial silicon (Si) layer 22 on a relaxed silicon-germanium (SiGe) layer overlying a silicon substrate 16. Relaxed SiGe layer 12 has a larger lattice constant compared to relaxed Si, and the thin layer 22 of epitaxial Si grown on the relaxed SiGe layer 12 will be under biaxial tensile strain, as shown in FIG. 1B. In the bulk MOSFET 10, both hole and electron mobilities are enhanced in the Si layer under biaxial tensile strain.

Figure 2:
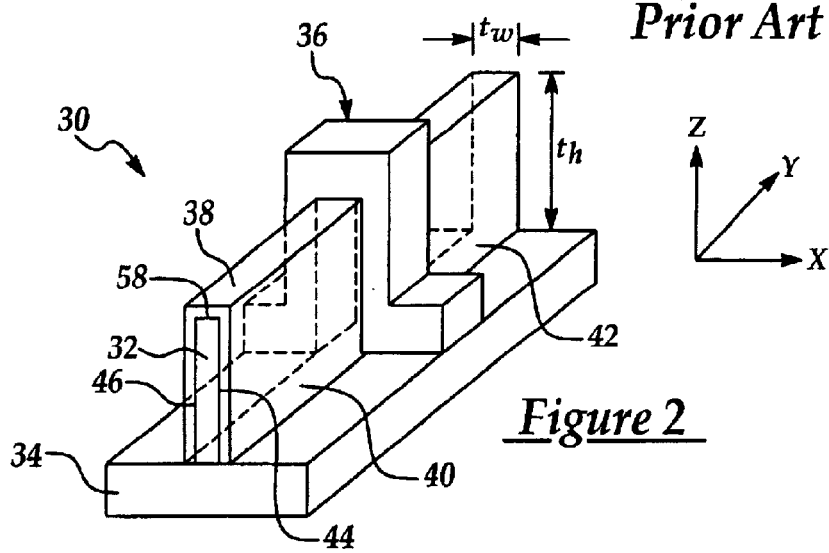
FIG. 2 is a perspective view of a present invention multiple-gate transistor.

FIG. 2 illustrates a perspective view of a present invention multiple-gate transistor 30 formed with a fin-like channel 32. The fin-like channel 32 extend vertically from an insulating substrate 34 with a height $t_h$ and a width $t_w$. An overlying gate 36 wraps around the gate dielectric layer 38 on the fin 32. The carriers in the channel flow in the source-to-drain direction, i.e., the y direction from source 40 to drain 42. It is advantageous to utilize a tall and narrow fin 32 to maximize the on state current while maintaining a good control of the short-channel effects. The height $t_h$ of the fin 32 is typically greater than 200 Å. A thickness of the fin width $t_w$ is between 50 Å and 500 Å. Given this range of thickness for $t_w$, it is difficult and impractical to fabricate a strained fin comprising multiple-layers of semiconductors with different lattice constants. Therefore, it is obvious that the technique used to induce strain in the bulk Si channel cannot be easily applied in the case of the multiple-gate transistor structure 10.

In addition, the device structure and orientation of the plane of the inversion sheet charge in a multiple-gate transistor is significantly different from that of the conventional bulk MOSFET. The conventional transistor has a channel inversion sheet charge oriented in the x-y plane, while the inversion sheet charge induced by the gates on the sidewalls of the multiple-gate transistor 30 of FIG. 2 is oriented in the y-z plane. This means that the nature of strain required for enhancement of carrier mobilities in a multiple-gate device may be significantly different from that used for the conventional bulk MOSFET.

Figure 3A:
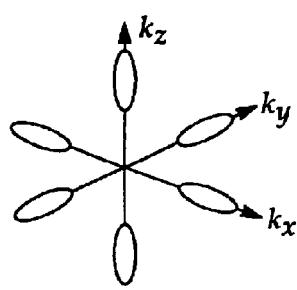
FIGS. 3A and 3B illustrate the six-fold degenerate conduction band valleys of relaxed silicon.
Figure 3B:
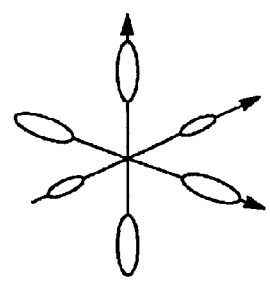
Figure 4A:
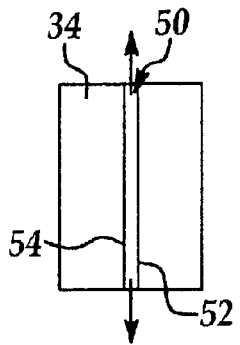
FIGS. 4A and 4B are plane view and perspective view of the present invention multiple-gate transistor under a tensile strain.
Figure 4B:
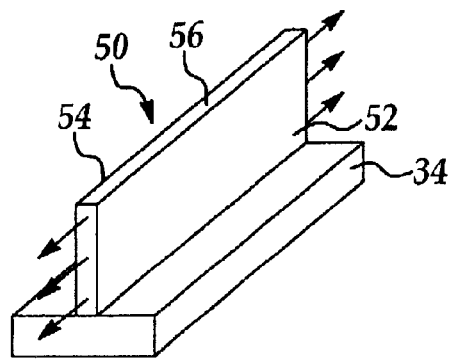

The useful strain required for mobility enhancement in a multiple-gate transistor is analyzed next. FIG. 3A shows the six-fold degenerate conduction band valleys of relaxed silicon. The electron population distributes equally among the six conduction band valleys. The net electrons motion in the channel is in the y direction. Therefore, as far as carrier transport is concerned, it would be beneficial to lift the energy of conduction valleys with higher effective mass in the y direction. By reducing the population of electrons in the valleys with higher effective mass in the y-direction, as shown in FIG. 3B, carrier transport may be improved. This can be done by the introduction of tensile strain in the y direction of fin 50, as diagrammatically illustrated in FIGS. 4A and 4B. The magnitude of tensile strain may range from 0.01% to 2%. In the preferred embodiment, the tensile strain magnitude is about 1% to 2%. Tensile strain in the y-direction is beneficial for both electron and hole transport in the y-direction. In addition, compressive strain in the y-direction is also beneficial for hole transport, and this can also be used for the P-channel multiple-gate transistors.

Figure 5A:
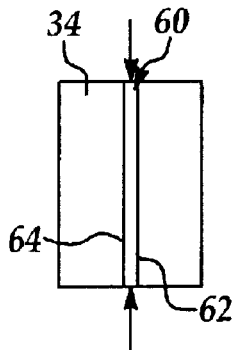
FIGS. 5A and 5B are plane view and perspective view of the present invention multiple-gate transistor under a compressive strain.
Figure 5B:
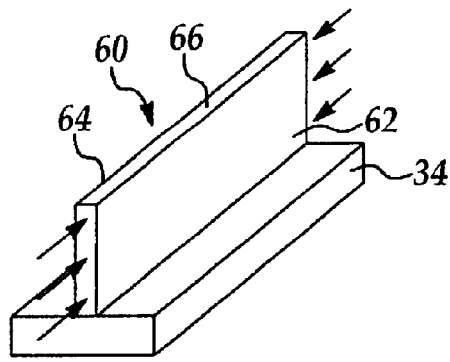
Figure 6:
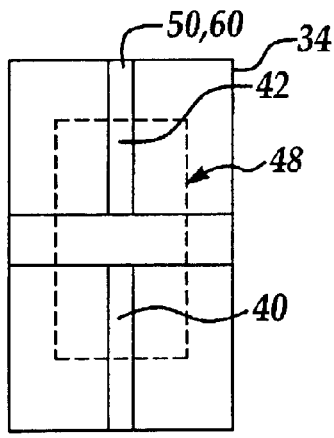
FIG. 6 is a plane view of the present invention multiple-gate transistor with a gate electrode and a thin film formed on top.
Figure 7:
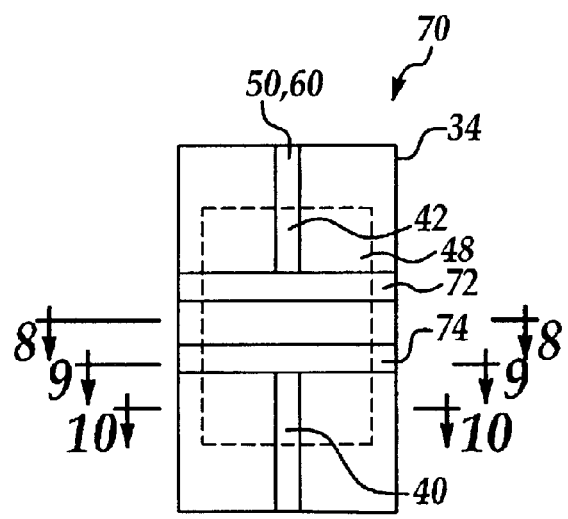
FIG. 7 is a plane view of another embodiment of the present invention multiple-gate transistor with a gate electrode and a thin film and two spacers formed on top.

The compressive strained channel fin 60 is illustrated in FIGS. 5A and 5B. The magnitude of compressive strain may range from 0.01% to 2%. In the preferred embodiment, the compressive strain magnitude is about 1% to 2%. A plane view of the present invention preferred embodiment device 30 (shown in FIG. 2) is shown in FIG. 6 further illustrating the thin film layer 48. A plane view of a present invention alternate embodiment device 70, which further incorporates a pair of sidewall spacers 72, 74, is shown in FIG. 7. The lightly-doped drain (LDD) or source/drain extension regions underlie the spacers 72, 74.

A method for the manufacture of the present invention multiple-gate transistors with tensile or compressive strain in the channel region is now described. The strain may have a component in the source to drain direction. An effective way to induce strain in the fin-like structure is to encapsulate the fin with a high stress thin film material after gate electrode formation. The fin surface in contact with a high-stress thin film material will be under stress as well. Due to the large difference in thermal expansion coefficient and Young's modulus between the fin and the thin film, significant stress of several hundred MPa to more than 1 GPa can be produced in the fin.

The thin film material may be a dielectric such as silicon nitride or silicon oxynitride deposited by various methods including chemical vapor deposition. In the thin film material that has a lower thermal expansion coefficient compared with the fin material, the part of the fin experiences compressive stress. If the thin film material has a higher thermal expansion coefficient compared with the fin material, the part of the fin experiences tensile stress.

As an example, plasma-enhanced chemical vapor deposited silicon nitride can be used to introduce tensile or compressive stress in the channel region. The residual film stress impacts the strain components in the channel. The residual film stress can be tailored from a high state of tension, for stoichiometric silicon nitride, to one of compression, for silicon-rich films. The tensile or compressive nature of the strain in the channel region can therefore be adjusted by varying process conditions such a temperature, pressure, and the ratio of the flow rate of as precursor gas, e.g., dichlorosilane, to the total gas flow rate.

Table I shows the thermal expansion coefficient α and Young's modulus E of other thin film materials that may be chosen. In addition, the thermal expansion coefficient and Young's modulus of silicon dioxide may be varied by the choice of the doping materials, such as germanium, nitrogen, or refractory metals, and also by the doping densities of these materials.

TABLE I

|  | α (K$^{-1}$) | E (GPa) |
| --- | --- | --- |
| Zirconium oxide | 11.1E−6 | 200 |
| Steatite (MgOSiO2) | 8.0E−6 | — |
| Aluminum oxide | 7.7E−6 | 390 |
| Aluminum nitride | 5.1E−6 | 380 |
| Silicon carbide | 4.3E−6 | 400 |
| Silicon nitride | 2.8E−6 to 3.6E−6 | 306 |
| Silicon | 2.0E−6 | 156 |
| Silicon dioxide | 5.0E−7 | — |

Figure 8A:
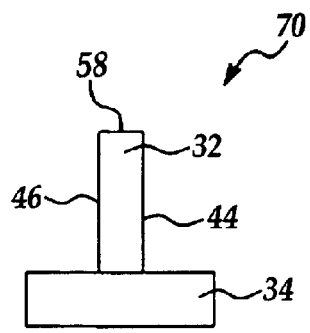
FIGS. 8A–8E are enlarged cross-sectional views illustrating areas process steps for the present invention transistor taken along lines A—A of FIG. 7.

The process for fabricating the present invention multiple-gate transistor is shown in FIGS. 8A~10E. FIGS. 8A~8E are taken along line A—A, FIGS. 9A~9E are taken along line B—B, while FIGS. 10A~10E are taken along line C—C in FIG. 7. Referring now to FIGS. 8A, 9A and 10A wherein a silicon-on-insulator substrates 34 are used to form silicon fins 32 on the buried oxide. The silicon fins 32 are patterned using an etch mask (not shown). The etch mask may comprise of a material commonly used for masking an etch process, such as photoresist, silicon oxide, silicon nitride, etc. In the preferred embodiment, the etch mask is silicon oxide. The silicon fin surface may be smoothened to improve or reduce the surface roughness of the fin sidewalls 44, 46. This is performed by subjecting the fin to a sacrificial oxidation and silicon sidewall treatment (e.g. high temperature anneal at 1000° C. in H$_2$ ambient). The surface smoothing of the fin sidewalls 44, 46 contributes to the achievement of good carrier mobilities and good gate oxide reliability. This is followed by removal of the silicon oxide etch mask. The removal of the etch mask on the silicon fin 32 allows the device to have a triple-gate structure since the gate electrode 36 (shown in FIGS. 8D~8E) is formed on each of the two sidewalls 44, 46 as well as the top surface 58 of the fin. The buried oxide under the silicon fin 32 may be undercut or notched using an etch process. This is shown in FIG. 11, in an alternate embodiment, wherein an undercut area 92 is shown. The etch process may be a plasma etch process or a wet etch process using dilute hydrofluoric acid (HF). The undercutting or notching of the substrate insulating layer 34 underlying the silicon fin 32 allows the formation of an omega-shaped gate electrode 32 as shown in FIGS. 8D~8E. This feature allows additional capacitive coupling between the gate and the channel underneath the fin, and the structure thus emulates a wrap-around gate but avoids the process difficulties associated with the implementation of the conventional wrap-around structure. The preceding description completes the fin formation process.

Figure 8B:
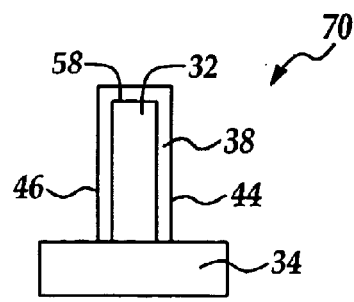
Figure 9A:
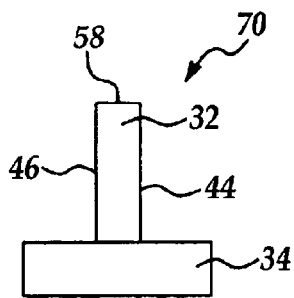
FIGS. 9A–9E are enlarged, cross-sectional views of the various process steps for the present invention transistor taken along lines B—B of FIG. 7.
Figure 9B:
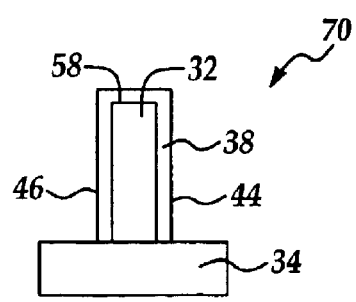
Figure 9C:
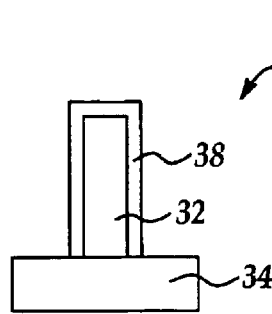

The process is then followed by the gate dielectric layer 38 shown in FIGS. 8B, 9B and 10B. The gate dielectric layer 38 may be formed by thermal oxidation, chemical vapor deposition, sputtering, etc. In general, the thickness of the gate dielectric may be different on the sidewall 44, 46 of the fin and the top 58 of the fin 32. Depending on the technique of the gate dielectric formation, the gate dielectric thickness on the fin top may be thinner than the thickness on the fin sidewall. In one embodiment, the gate dielectric thickness on the top surface of the fin is less than 20 Å. The gate dielectric may comprise of a conventional material such as silicon dioxide or silicon oxynitride with a thickness ranging from 3 Å to 100 Å, preferably 10 Å or less. The gate dielectric may also comprise of high permittivity (high-k) materials such as aluminum oxide $Al_2O_3$, hafnium oxide $HfO_2$, zirconium oxide $ZrO_2$, with an equivalent oxide thickness between 3 angstroms and 100 angstroms.

Figure 8C:
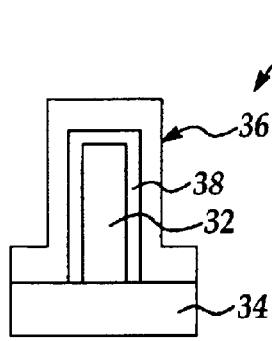
Figure 8D:
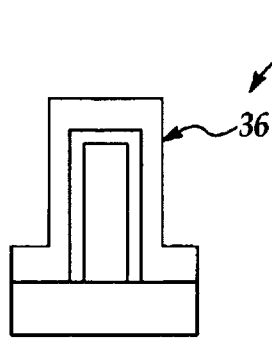

Next, the gate material is deposited and formed into a gate electrode 36. This is shown in FIG. 8C. The gate material may be polycrystalline-silicon (poly-Si), poly-crystalline silicon-germanium (poly-SiGe), a refractory metal such as molybdenum and tungsten, compounds such as titanium nitride, or other conducting materials. Implants known as work function implants may be introduced in the gate to alter the work function of the electrode. A gate mask is defined and the underlying gate material is etched to form the gate electrode. The gate etch stops on the gate dielectric, and the gate is electrically isolated from the transistor structure by the gate dielectric. In the preferred embodiment, the gate material is poly-Si and the gate oxide is silicon oxynitride. A plasma etch using chlorine and bromine chemistry may be used to achieve a high etch selectivity in excess of 2000. A high etch selectivity is critical for device structures with a tall fin and aggressively scaled gate oxide thickness. After the definition of the gate, the masking material is removed.

Figure 9D:
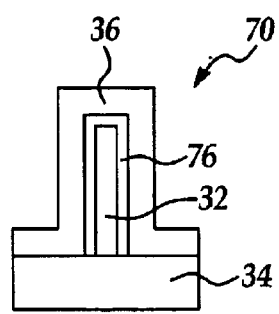

The lightly-doped drain (LDD) or source/drain extension 76 is formed next. This is shown in FIGS. 9D.about.9E. This may be achieved by ion implantation, plasma immersion ion implantation (PIII), or other techniques known and used in the art. Next, a spacer is formed on the sidewalls of the gate and the channel by deposition and selective etching of the spacer material. The spacer material may comprise of a dielectric material such as silicon nitride or silicon dioxide. In the preferred embodiment, the spacer comprises a silicon nitride/silicon oxide composite. After the spacer formation, source and drain regions are doped by ion implantation, PIII, gas or solid source diffusion, or any other techniques known and used in the art. Any implant damage or amorphization can be annealed through subsequent exposure to elevated temperatures. The resistance of the source and drain can also be reduced by strapping the source/drain with a conductive material. This can be achieved by self-aligned silicide (salicide) process, by other metal, poly-Si, or by epitaxial silicon deposition. The conductive material may be formed on both the top of the fin as well as the sidewalls of the fin. In the preferred embodiment, the conductive material utilized is nickel silicide.

Figure 8E:
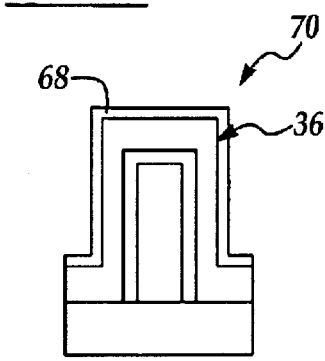
Figure 9E:
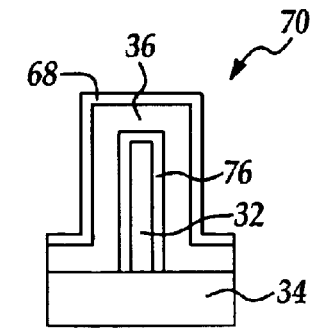

A high-stress thin film 68 is then deposited. This is shown in FIGS. 8E, 9E and 10E. The thin film 68 may have a thickness of between 50 Å and 1000 Å. A heavily doped source region 78 is also shown in FIG. 10E. In the preferred embodiment, the thin film material is silicon nitride with a thickness of about 600 Å. The thin film material introduces significant strain in the channel region of the multiple-gate transistor. In one embodiment, a thin film material is selected such that the strain in the channel in the multiple-gate transistor of FIGS. 4A and 4B has a tensile component in the source-to-drain direction for enhancement of the electron as well as hole mobilities. In another embodiment, a thin film material is selected such that the strain is in the source-to-drain direction for enhancement of the electron as well as hole mobilities. In still another embodiment, a thin film material is selected such that the strain in the p-channel transistor is compressive (as shown in FIGS. 5A~5B) for enhancement of hole mobility. The high-stress thin film material may be patterned, and another high-stress material may be deposited so that channels with different strain may be incorporated on the same wafer. Passivation, contact etch, metallization are then performed by conventional methods to complete the devices.

While the present invention has been described in an illustrative manner, it should be understood that the terminology used is intended to be in a nature of words of description rather than of limitation.

Furthermore, while the present invention has been described in terms of a preferred and alternate embodiments, it is to be appreciated that those skilled in the art will readily apply these teachings to other possible variations of the inventions.

The embodiment of the invention in which an exclusive property or privilege is claimed are defined as follows.

What is claimed is:

1. A multiple-gate semiconductor structure comprising: a substrate; a fin formed of a semi-conducting material having a top surface and two sidewall surfaces, said fin subjected to a strain of at least 0.01% and being positioned vertically on said substrate; source and drain regions formed in said semi-conducting material of said fin with said fin bridging over said source and drain regions; a gate dielectric layer overlying said fin; and a gate electrode wrapping around said fin on said top surface and said two sidewall surfaces of said fin overlying said gate dielectric layer; a layer of a thin film overlying said gate electrode, said layer of said thin film encapsulating said fin on said top surface and said two sidewall surfaces, and wherein said thin film overlays at least partially said source and drain regions.

2. The structure of claim 1, wherein said fin is under tensile strain in the source-to-drain direction.

3. The structure of claim 2, wherein a magnitude of said strain is between 0.01% and 2%.

4. The structure of claim 1, wherein said semi-conducting material comprises silicon.

5. The structure of claim 1, wherein said fin is rounded at the top corners.

6. The structure of claim 1, wherein said gate dielectric layer comprises silicon oxide.

7. The structure of claim 1, wherein said gate dielectric layer comprises silicon oxynitride.

8. The structure of claim 1, wherein said gate dielectric layer comprises a high permittivity material selected from the group consisting of $La_2O_3$, $Al_2O_3$, $HfO_2$, HfON and $ZrO_2$.

9. The structure of claim 8, wherein a relative permittivity of said gate dielectric layer is at least 5.

10. The structure of claim 1, wherein said gate dielectric layer has a thickness between 3 Å and 100 Å.

11. The structure of claim 1, wherein said gate dielectric layer has a different thickness on said two sidewall surfaces and said top surface of the fin.

12. The structure of claim 1, wherein said gate dielectric layer has a first thickness on the top surface of the fin and a second thickness on the sidewall surfaces of the fin, said first thickness being smaller than said second thickness.

13. The structure of claim 1, wherein said gate dielectric layer has a thickness of less than 20 Å on the top surface of the fin.

14. The structure of claim 1, wherein said gate electrode comprises polycrystalline silicon.

15. The structure of claim 1, wherein said gate electrode comprises polycrystalline silicon germanium.

16. The structure of claim 1, wherein said gate electrode comprises metal.

17. The structure of claim 1, wherein said source and drain regions each comprises a lightly doped or extension region.

18. The structure of claim 1, wherein said source and drain regions are straddled by a conductive material such as metal or silicide.

19. The structure of claim 1, wherein contacts between said gate electrode and said source and drain regions are on at least one of the sidewall surfaces and on the top surface of the fin.

20. The structure of claim 1, wherein said thin film layer has a thickness ranging between 50 Å and 1000 Å.

21. The structure of claim 1, wherein said thin film layer has a thickness of 600 Å.

22. The structure of claim 1, wherein said thin film layer has a thickness ranging between 50 Å and 1000 Å.

23. The structure of claim 1, wherein said thin film layer has a thickness of 600 Å.

24. A multiple-gate semiconductor structure comprising: a substrate having a depression in a top surface, said depression comprises an undercut or a notch; a fin formed of a semi-conducting material having a top surface and two sidewall surfaces, said fin being subjected to a strain of at least 0.01% and being positioned vertically juxtapose to said depression in said top surface of the substrate; a gate dielectric layer overlying said fin; and a gate electrode wrapping around said fin on said two sidewall surfaces, said top surface, and a bottom of a base of said fin; a layer of a thin film overlying said gate electrode, said layer of said thin film encapsulating said fin on said top surface and said two sidewall surfaces, and wherein said thin film overlays at least partially said source and drain regions.

25. The method of claim 24, wherein said fin is under tensile strain in the source-to-drain direction.

26. The method of claim 25, wherein a magnitude of said strain is between 0.01% and 2%.

27. The method of claim 24, wherein said semi-conducting material comprises silicon.

28. The method of claim 24, wherein said fin is rounded at the top corners.

29. The method of claim 24, wherein said gate dielectric layer comprises silicon oxide.

30. The structure of claim 24, wherein said gate dielectric layer comprises silicon oxynitride.

31. The structure of claim 24, wherein said gate dielectric layer comprises a high permittivity material selected from the group consisting of $La_2O_3$, $Al_2O_3$, $HfO_2$, $HfON$ and $ZrO_2$.

32. The structure of claim 24, wherein a relative permittivity of said gate dielectric layer is at least 5.

33. The structure of claim 24, wherein said gate dielectric layer has a thickness between 3 Å and 100 Å.

34. The structure of claim 24, wherein said gate dielectric layer has a different thickness on said sidewall surfaces and said top surface of the fin.

35. The structure of claim 24, wherein said gate dielectric layer has a first thickness on the top surface of the fin and a second thickness on the sidewall surfaces of the fin, said first thickness being smaller than said second thickness.

36. The structure of claim 24, wherein said gate dielectric layer has a thickness of less than 20 Å on the top surface of the fin.

37. The structure of claim 24, wherein said gate electrode comprises polycrystalline silicon.

38. The structure of claim 24, wherein said gate electrode comprises polycrystalline silicon germanium.

39. The structure of claim 24, wherein said gate electrode comprises a metal.

40. The structure of claim 24, wherein said source and drain regions each comprises a lightly doped or extension region.

41. The structure of claim 24, wherein said source and drain regions are straddled by a conductive material such as metal or silicide.

42. The structure of claim 24, wherein contacts between said gate electrode and said source and drain regions are on said sidewall surfaces and said top surface of the fin.

* * * * *